(12) United States Patent
van Dijk

(10) Patent No.: US 9,653,912 B2
(45) Date of Patent: May 16, 2017

(54) INRUSH CURRENT LIMITER

(71) Applicant: NXP B.V., Eindhoven (NL)

(72) Inventor: Luc van Dijk, Nijmegen (NL)

(73) Assignee: NXP B.V., Eindhoven (NL)

( * ) Notice: Subject to any disclaimer, the term of this patent is extended or adjusted under 35 U.S.C. 154(b) by 302 days.

(21) Appl. No.: 14/572,274

(22) Filed: Dec. 16, 2014

(65) Prior Publication Data

US 2016/0172844 A1    Jun. 16, 2016

(51) Int. Cl.
*H02H 9/00* (2006.01)
*H02H 9/02* (2006.01)
*G01R 19/00* (2006.01)
*H02H 1/00* (2006.01)

(52) U.S. Cl.
CPC ............ *H02H 9/025* (2013.01); *H02H 9/001* (2013.01); *G01R 19/0092* (2013.01); *H02H 1/0007* (2013.01)

(58) Field of Classification Search
CPC ...................................... H02H 9/025
USPC ....................................... 361/91.5
See application file for complete search history.

(56) References Cited

U.S. PATENT DOCUMENTS

| | | | | |
|---|---|---|---|---|
| 4,893,158 A * | 1/1990 | Mihara | ............... | H01L 27/0251 257/341 |
| 5,272,392 A * | 12/1993 | Wong | ................... | H03K 17/063 327/109 |
| 5,714,809 A | 2/1998 | Clemo | | |
| 5,977,734 A | 11/1999 | Lu et al. | | |
| 7,365,559 B2 * | 4/2008 | Colbeck | ............. | G01R 19/0092 324/762.09 |
| 8,004,808 B2 | 8/2011 | Nakamura | | |
| 8,270,138 B2 * | 9/2012 | Takahashi | .......... | H03K 17/0822 361/101 |
| 2013/0110432 A1 | 5/2013 | Mickelsen | | |

FOREIGN PATENT DOCUMENTS

| | | |
|---|---|---|
| EP | 2001096 A2 | 12/2008 |
| WO | 2007009675 | 1/2007 |
| WO | 2009126238 A1 | 10/2009 |

OTHER PUBLICATIONS

Partial Extended European Search Report for Patent Appln. No. 15200152.5 (Jul. 8, 2016).
Extended European Search Report for Patent Appln. No. 15200152.5 (Jan. 11, 2017).

* cited by examiner

*Primary Examiner* — Stephen W Jackson
(74) *Attorney, Agent, or Firm* — Rajeev Madnawat

(57) ABSTRACT

An inrush current limiter for electronic fuses detects the type of load connected to the electronic fuse at ignition. By detecting the type of load, the limiter prevents a large peak current from flowing through the fuse. When a short circuit occurs, the limiter ensures that the electronic fuse only operates once in linear mode.

20 Claims, 4 Drawing Sheets

INRUSH CURRENT LIMITER

TECHNICAL FIELD

Various illustrative embodiments disclosed herein relate generally to limiting inrush currents.

SUMMARY

A brief summary of various illustrative embodiments is presented below. Some simplifications and omissions may be made in the following summary, which is intended to highlight and introduce some aspects of the various illustrative embodiments, but not to limit the scope of the invention. Detailed descriptions of an illustrative embodiment adequate to allow those of ordinary skill in the art to make and use the inventive concepts will follow in later sections.

Various illustrative embodiments relate to an inrush current limiter including a current sensing device coupled to a main device that is configured to sense a scaled sense current from the main device; a current control device coupled to the current sensing device; a gate driver coupled to the main device and the current control device that is configured to drive a gate-to-source voltage of the main device; and a source voltage monitor coupled to the gate driver and the current control device, wherein the source voltage monitor is configured to monitor a source voltage of the main device.

In various illustrative embodiments, the current sensing device may be an operational amplifier. The operational amplifier may measure a voltage from the main device at a terminal that is compensated for resistive losses. The main device may be a metal-oxide-semiconductor field-effect transistor (MOSFET) device, which may include a main MOSFET and a sense MOSFET. A scaled sense current of the sense MOSFET may be substantially 2000 times smaller than a current of the main MOSFET. The source voltage monitor may further include a level shifting device; an analog to digital converter (ADC); and a voltage comparator. The ADC may include a successive approximation register (SAR), which may be a 12-bit SAR.

Further, various illustrative embodiments relate to an inrush current limiter including a current control device coupled to a main device that compensates for resistive losses in the main device; a gate driver coupled to the main device and the current control device that is configured to drive a gate-to-source voltage of the main device; and a source voltage monitor coupled to the gate driver and the current control device, wherein the source voltage monitor is configured to monitor a source voltage of the main device.

In various illustrative embodiments, the main device may be a metal-oxide-semiconductor field-effect transistor (MOSFET) device, which may include a main MOSFET and a sense MOSFET. The source voltage monitor may further include a level shifting device; an analog to digital converter (ADC); and a voltage comparator. The ADC comprises a successive approximation register (SAR), which may be a 12-bit SAR.

Further, various illustrative embodiments relate to a method of limiting an inrush current in a main device, the method including sensing a scaled sense current from the main device; controlling a current in the main device based upon the scaled sense current; driving a gate-to-source voltage of the main device with the controlled current; and monitoring an output voltage of the main device to identify a type of load coupled to the main device.

In various illustrative embodiments, the load coupled to the main device may be determined to be a capacitive load when the output voltage displays a linear increase. A gate of the main device may be charged when the load is determined to be the capacitive load.

In various illustrative embodiments, the load coupled to the main device may be determined to be a low ohmic load when the output voltage does not change. The main device may be disabled when the load is determined to be the low ohmic load.

BRIEF DESCRIPTION OF THE DRAWINGS

In order to better understand various illustrative embodiments, reference is made to the accompanying drawings, wherein.

To facilitate understanding, identical reference numerals have been used to designate elements having substantially the same or similar structure and/or substantially the same or similar function.

DETAILED DESCRIPTION

The description and drawings illustrate the principles of the invention. It will thus be appreciated that those skilled in the art will be able to devise various arrangements that, although not explicitly described or shown herein, embody the principles of the invention and are included within its scope. Furthermore, all examples recited herein are principally intended expressly to be for pedagogical purposes to aid the reader in understanding the principles of the invention and the concepts contributed by the inventor(s) to furthering the art, and are to be construed as being without limitation to such specifically recited examples and conditions. Additionally, the term, "or," as used herein, refers to a non-exclusive or (i.e., and/or), unless otherwise indicated (e.g., "or else" or "or in the alternative"). Also, the various embodiments described herein are not necessarily mutually exclusive, as some embodiments can be combined with one or more other embodiments to form new embodiments. As used herein, the terms "context" and "context object" will be understood to be synonymous, unless otherwise indicated.

Fuses are often used to protect wiring and electrical equipment from excessive currents. A need for fuses is especially acute for vehicles, such as automobiles. Blade-type, Bosch-type, Lucas-type, glass-tube-type, and limiter-type fuses have been used in various cars and trucks.

When such fuses operate, they may "trip" when a hazardous condition occurs. After repeated operation, the fuse may be "blow," causing a failure in operation. Thus, such fuses may have to be replaced regularly as a "blown fuse" will cause something in the vehicle to no longer work properly.

Figure 1A:
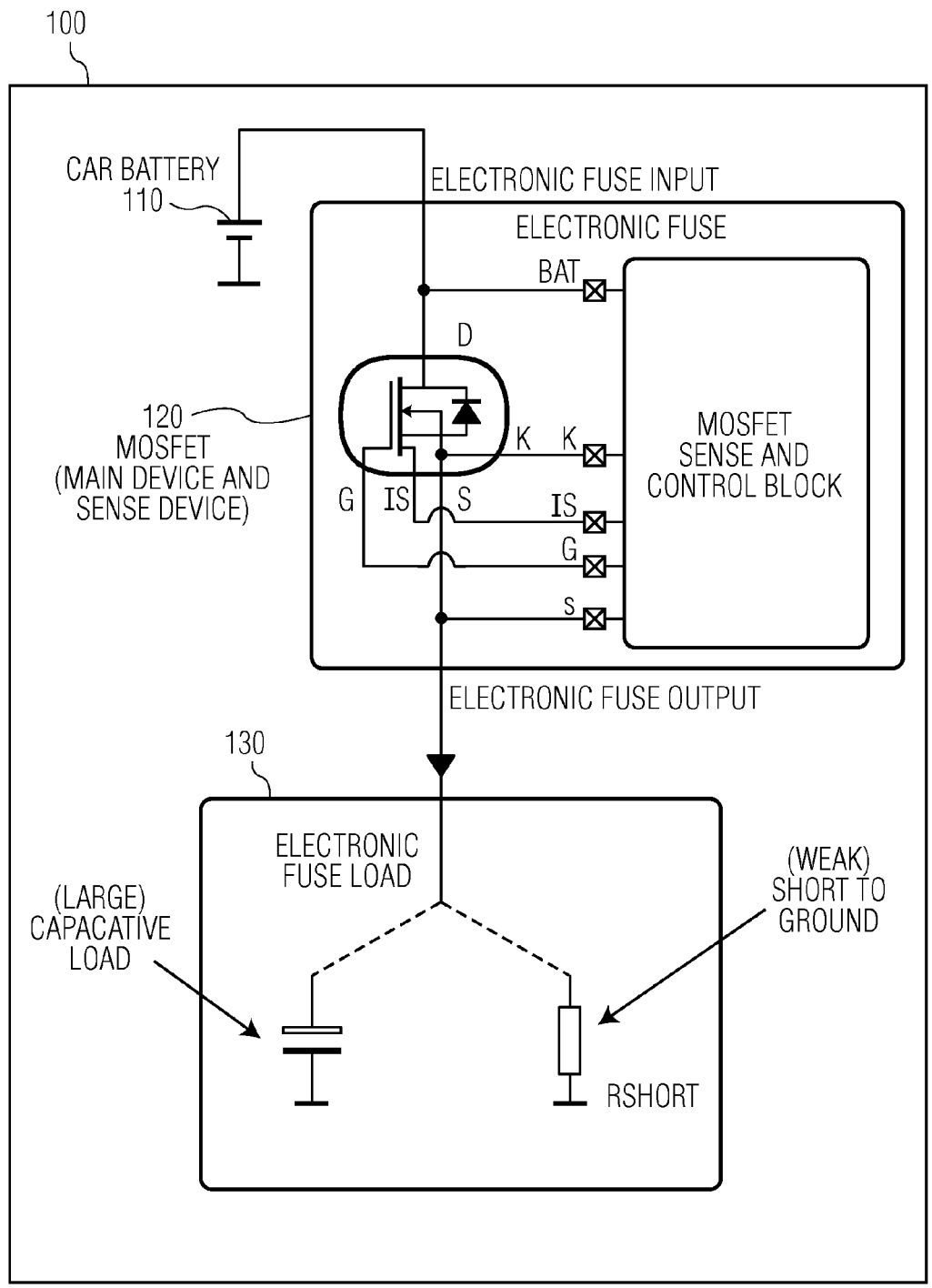
FIG. 1A illustrates a circuit having an electronic fuse.

FIG. 1A illustrates a circuit 100 having an electronic fuse 120. The fuse 120 is connected between a battery 110 and a load 130. In the illustrated embodiment, battery 110 is a car battery. In the illustrated embodiment, load 130 may include either a capacitive load or a low ohmic load, but other types of loads may be included as well. Batteries or DC power sources may be used.

Electronic fuse 120 may replace other fuses for automotive applications, as well as for non-automotive applications. Fuses may need to charge large capacitive loads during ignition. In an automotive application, this charging process may cause current peaks as large as several hundred amperes. Such transient currents may be of the same order of magnitude as current peaks that would be associated with a short circuit at the load 130 of the fuse 100. The electronic fuse 120 seeks to differentiate between these scenarios.

Fuses repeatedly charge large capacitive loads during ignition. During the charging process, an electronic fuse may provide a more sophisticated response. Instead of responding in the same way to each load, the improved electronic fuse may first determine the type of load. After determining the type of load, the electronic fuse may respond in various ways that are appropriate for the determined type of load, as described in further detail below.

Electronic fuse 120 may behave differently depending upon the type of load 130 that is attached. When load 130 is a low ohmic load, such as a short to ground, electronic fuse 120 may not trip. Thus, when a short is present in the system, electronic fuse 120 does not conduct an overly large peak current.

When load 130 is a large capacitive load, electronic fuse 120 may produce a relatively small transient current during ignition. A fuse may be blown by repeated exposure to large transient currents, so reducing the transient current may be beneficial. The reduction of the transient currents may significantly improve the Electro Magnetic Compatibility (EMC) behavior of the system. For an automotive application, the battery 110 and associated cabling may be subject to transient currents up to 15,000 times over the life of each electronic fuse 120, so reduction of the transient currents may be quite beneficial.

In general, electronic fuse 120 is an active device, capable of measuring various currents and voltages. Rather than permitting excessively high currents, electronic fuse 120 may limit the current and dissipate the excess power as heat. Electronic fuse 120 may also be designed to avoid repetitive operation, thereby limiting stress on the device and build-up of excessive heat.

Figure 1B:
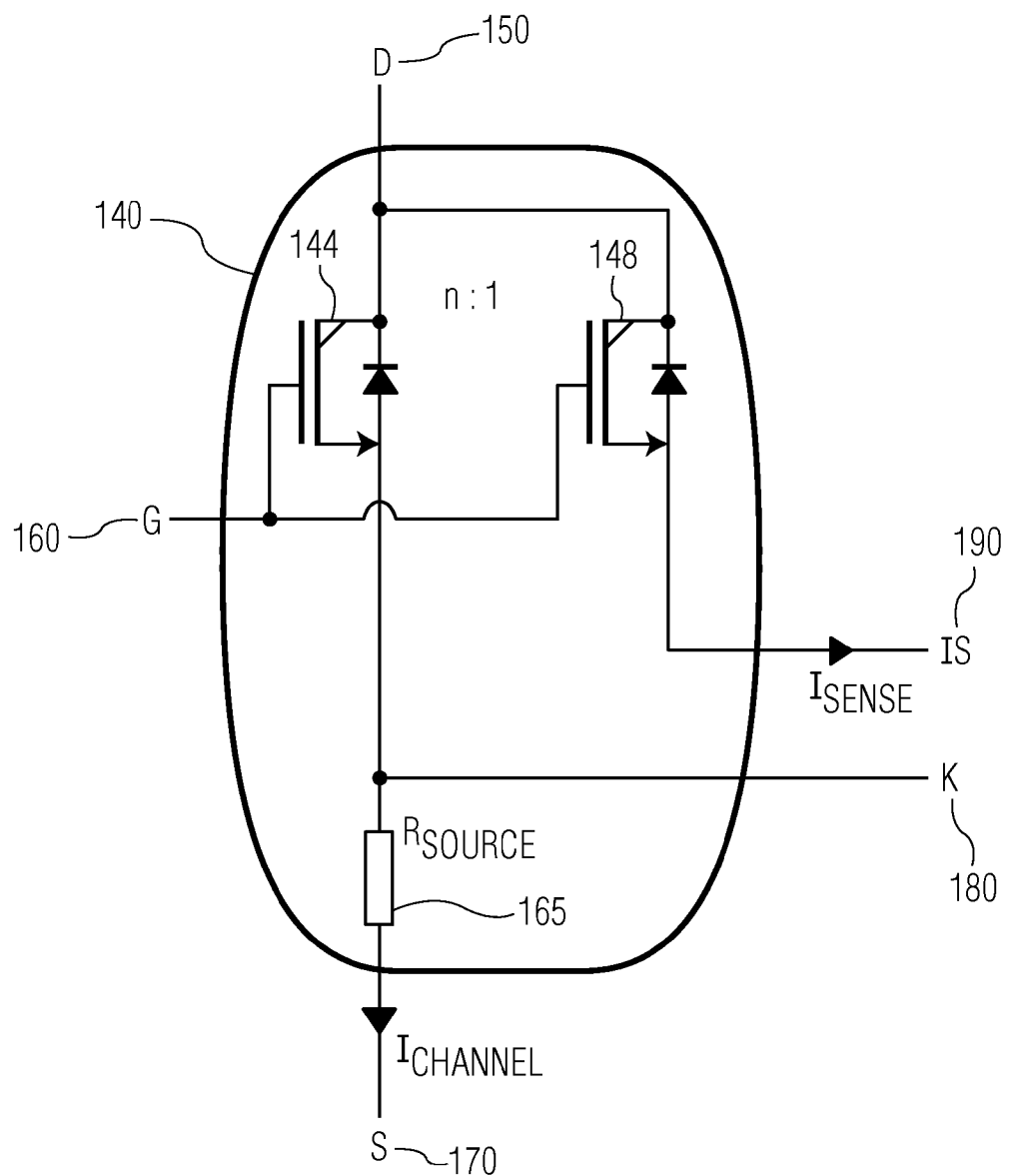
FIG. 1B illustrates a power MOSFET for the electronic fuse.

FIG. 1B illustrates details of a power Metal Oxide Semiconductor Field Effect Transistor (MOSFET) 140 for electronic fuse 120. Power MOSFET 140 includes a Drain (D) terminal 150, a Gate (G) terminal 160, a Source (S) terminal 170, a Kelvin (K) terminal 180, and a Sense Current (IS) terminal 190. MOSFET 140 has a Drain-Source resistance that varies as a function of the voltage difference between the G terminal 160 and the S terminal 170. When the voltage difference between the G terminal 160 and the S terminal 170 is minimal, MOSFET 140 resembles an open switch. Conversely, the Drain-Source resistance of MOSFET 140 decreases when an appropriate voltage is applied between the G terminal 160 and the S terminal 170, allowing current to flow between the S terminal 170 and the D terminal 150.

As depicted in FIG. 1B, power MOSFET 140 includes a main MOSFET 144 and a sense MOSFET 148. Sense MOSFET 148 may be a scaled-down version of main MOSFET 144. The size ratio between main MOSFET 144 and sense MOSFET 148, depicted as "n: 1," may be as large as 2000. As a result, sense MOSFET 148 may have a current at the IS terminal 190 that is 2000 times smaller than the current for main MOSFET 144 at the S terminal 170. Consequently, sense MOSFET 148 may be used as a measurement tool.

The K terminal 180 may also be used for measurement. While the S terminal 170 is the ideal source for main MOSFET 144, a real MOSFET has source bond-wires that are can have considerable resistance. The resistance of the source bond-wires, symbolized as $R_{Sbw}$ 165, can be as large as 50% of the total resistance of main MOSFET 144. Thus, the S terminal 170 suffers from a considerable voltage drop across $R_{Sbw}$ 165, resulting in an output voltage that is smaller than the true source voltage. In contrast, the K terminal 180 may provide a highly accurate measure of the true source voltage for MOSFET 144.

The addition of the K terminal 180 and the IS terminal 190 to power MOSFET 140 provides diagnostic information to monitor the status of MOSFET 140. By measuring the true source voltage at the K terminal 180 instead of the S terminal 170, a build-up of voltage on the bond-wires is not decreasing accuracy for current sensing. The IS terminal 190 can be used to safely observe the current on main MOSFET 144, because the current flowing through sense MOSFET 148 is scaled down by a large factor, such as two thousand.

Figure 2:
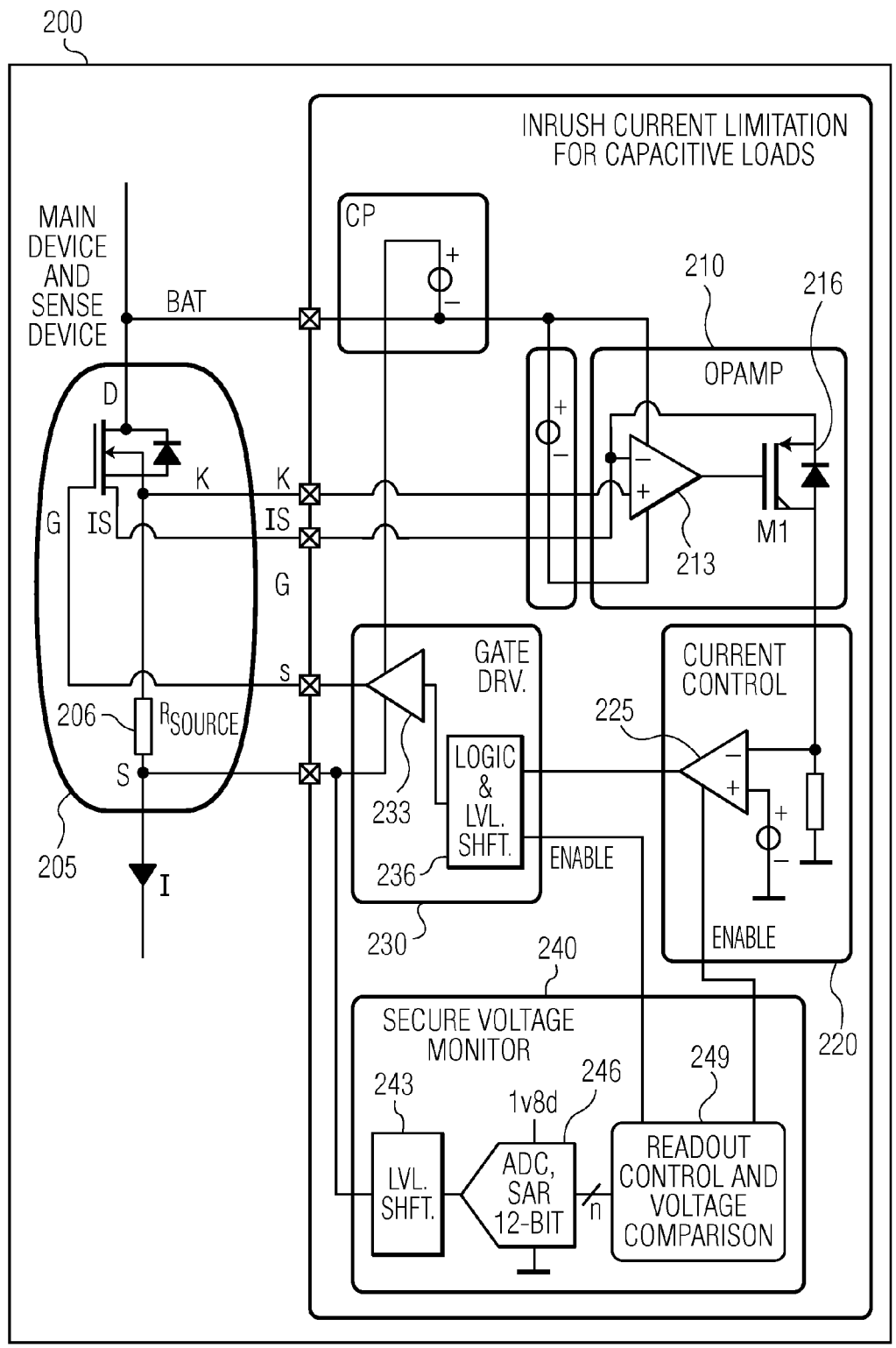
FIG. 2 illustrates a first embodiment for an inrush current limiter.

FIG. 2 illustrates a first embodiment for an inrush current limiter 200. Inrush current limiter 200 may include a first circuit 210, a current controller 220, a gate driver 230, and a source voltage monitor 240.

Inrush current limiter 200 may be connected to electronic fuse 205 through a plurality of terminals. In an illustrative embodiment, electronic fuse 205 may include a MOSFET having drain, gate, and source terminals. This MOSFET may include a main MOSFET 144 and a sense MOSFET 148, as previously described for FIG. 1B. The drain of electronic fuse 205 may be coupled to battery 110 while the source of electronic fuse 205 may be coupled to load 130. In this illustrative embodiment, Rsource 206 represents the source resistance of electronic fuse 205. The gate of electronic fuse 205 may be coupled to inrush current limiter 200.

First circuit 210 may be coupled to the K and IS terminals of electronic fuse 205. In an illustrative embodiment, first circuit 210 may include an operational amplifier 213 and a MOSFET 216. First circuit 210 may sense a current at the gate of electronic fuse 205 by having an inverting terminal of operational amplifier 213 coupled to the IS terminal of electronic fuse 205 while the non-inverting terminal of operational amplifier 213 is coupled to the K terminal of electronic fuse 205.

For measurement, the inverting terminal of operational amplifier 213 may be coupled to the IS terminal of electronic fuse 205 in order to limit the exposure of operational amplifier 213 to large currents. As described above for FIG. 1B, sense MOSFET 148 may have a current at the IS terminal 190 that may be two thousand times smaller than the current for main MOSFET 144 at the S terminal 170. Consequently, for protection from large current spikes, operational amplifier 213 measures the relatively small current at the IS terminal of MOSFET 205.

As described above for FIG. 1B, the K terminal 170 of the main MOSFET 144 may report a true source voltage, compensating for the voltage drop between the S terminal 160 and the K terminal 170 across $R_{Sbw}$ 165. In a similar manner, the non-inverting terminal of operational amplifier 213 measures the true source voltage of MOSFET 205. It compensates for the voltage drop across $R_{source}$ 206.

Current controller 220 may include an amplifier circuit 225. In an illustrative embodiment, amplifier circuit 225 may be coupled at a negative terminal to MOSFET 216 within first circuit 210. A positive terminal of amplifier circuit 225 may be coupled to a reference voltage.

Gate driver 230 may include an amplifier 233 and a level shifter 236. Gate driver 230 may be coupled to the gate (G) terminal of electronic fuse 205, the source (S) terminal of electronic fuse 205, and current controller 220. Amplifier 233 may be coupled to both the G and S terminals of electronic fuse 205. Level shifter 236 may be coupled to current controller 220.

Source voltage monitor 240 may include a level shifter 243, an analog to digital converter (ADC) 246, and a voltage comparator 249. Source voltage monitor 240 may be coupled to the S terminal of electronic fuse 205, current controller 220, and gate driver 230. Level shifter 243 may be coupled to the S terminal of electronic fuse 205. Voltage comparator 249 may be coupled to both the current controller 220 and the gate driver 230.

In an illustrative embodiment, ADC 246 may include a Successive Approximation Register (SAR). In a further embodiment, the SAR may be a 12-bit SAR. Other implementations are possible.

At ignition of the car or at another event that produces a large transient current, current limiter 200 may configure the MOSFET of electronic fuse 205 as a constant current source. In particular, current limiter 200 may limit the current through load 130 to a relatively small, constant value that reduces the risk of damage to electronic fuse 205.

Once the current through the electronic fuse 205 is at a desired level, source voltage monitor 240 may measure the output voltage at the source of electronic fuse 205. When load 130 is a capacitive load, the monitored output voltage will show a linear increase. When load 130 is a low ohmic load, such as a short to ground, the monitored output voltage will not substantially change.

Electronic fuse 205 may increase the charge at the gate of the MOSFET, using gate driver 230, in case of a capacitance load 130, while the MOSFET will be disabled for a low ohmic load 130. This will reduce the risk of damage to the MOSFET. Moreover, the substantially constant current level may be relatively low compared to an unstable current subject to transient spikes. These two factors may provide for safer operation of the MOSFET.

At ignition of the car or at another event that produces a large transient current, electronic fuse 205 may dissipate a lot of power, especially when a short to ground is present. The amount of dissipated power across the electronic fuse 205 is equal to a product of the voltage drop across the electronic fuse 205 and the constant current set by the electronic fuse 205. Simulations have shown that the MOSFET can safely handle this dissipated power even at the high ambient temperatures requested by the customer.

In summary, the electronic fuse 205 prevents large currents from flowing in the system at ignition of the car or at another event that produces a large transient current, regardless of the type of load 130 that is connected to the electronic fuse 205. This protection exists even when load 130 is a short circuit. This factor helps protect components such as the car battery 110 and any attached items, such as a cabling harness.

No repetitive avalanche operations occur in the MOSFET at power-on Thus, EMC behavior of the system is significantly improved. This scenario can occur up to 20,000 times over the lifetime of the car, so the elimination of a repetitive avalanche pattern is a significant benefit.

Figure 3:
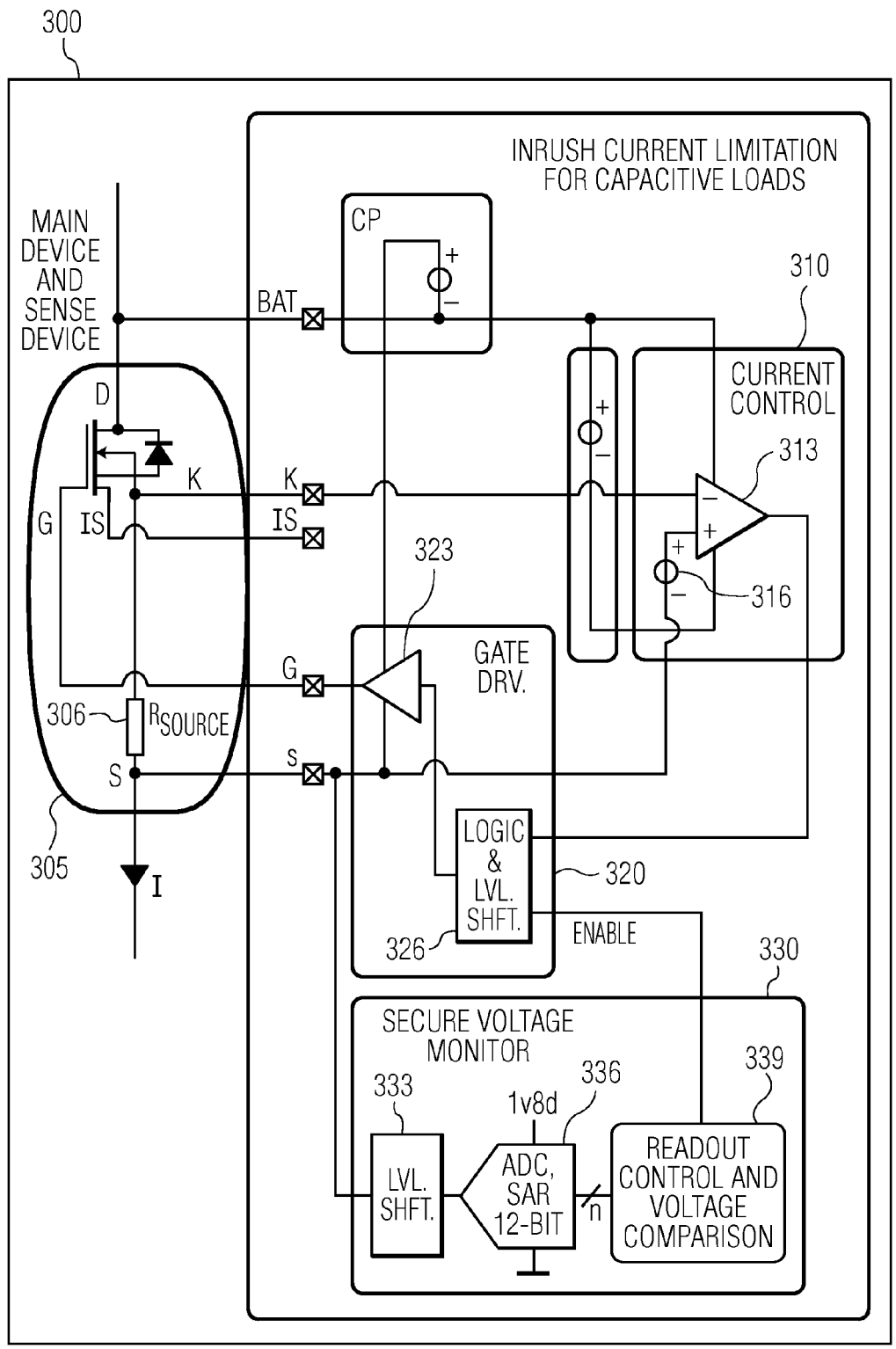
FIG. 3 illustrates a second embodiment for an inrush current limiter.

FIG. 3 illustrates a second embodiment for an inrush current limiter 300. Inrush current limiter 300 may include a current controller 310, a gate driver 320, and a source voltage monitor 330.

Inrush current limiter 300 may be connected to electronic fuse 305 through a plurality of terminals. In an illustrative embodiment, electronic fuse 305 may include a Metal Oxide Semiconductor Field Effect Transistor (MOSFET) having drain, gate, and source terminals. The drain of electronic fuse 305 may be coupled to battery 110 while the source of electronic fuse 305 may be coupled to load 130. In this illustrative embodiment, Rsource 306 represents the source resistance of electronic fuse 305. The gate of electronic fuse 305 may be coupled to inrush current limiter 300.

Current controller 310 may include an amplifier circuit 313. In an illustrative embodiment, amplifier circuit 313 may be coupled at a negative terminal to K terminal of electronic fuse 305. The positive terminal of amplifier circuit 313 may coupled to a source (S) terminal of electronic fuse 305 through a reference voltage 316.

Gate driver 320 may include an amplifier 323 and a level shifter 326. Gate driver 320 may be coupled to the gate (G) terminal of electronic fuse 305, the S terminal of electronic fuse 305, and current controller 310. Amplifier 323 may be coupled to both the G and S terminals of electronic fuse 305. Level shifter 326 may be coupled to current controller 310.

Source voltage monitor 330 may include a level shifter 333, an analog to digital converter (ADC) 336, and a voltage comparator 339. Source voltage monitor 330 may be coupled to the S terminal of electronic fuse 305, current controller 310, and gate driver 320. Level shifter 333 may be coupled to the S terminal of electronic fuse 305. Voltage comparator 339 may be coupled to gate driver 320.

In an illustrative embodiment, ADC 336 may include a Successive Approximation Register (SAR). In a further embodiment, the SAR may be a 12-bit SAR. Other implementations are possible.

It should be noted that various aspects of the above embodiments may be combined resulting in other embodiments. Also, various steps in the methods may be performed in a different order or simultaneously. Also various aspects of the embodiments above may be implemented using processors and computer instructions to result in a specific machine implementing the embodiment. Also, portions of the embodiments above may be implemented using ASICs or other specific hardware elements.

As used herein, the term "processor" will be understood to encompass a variety of devices such as microprocessors, field-programmable gate arrays (FPGAs), application-specific integrated circuits (ASICs), and other similar processing and computing devices.

It should be appreciated by those skilled in the art that any block diagrams herein represent conceptual views of illustrative circuitry embodying the principles of the invention.

Although the various illustrative embodiments have been described in detail with particular reference to certain illustrative aspects thereof, it should be understood that the invention is capable of other embodiments and its details are capable of modifications in various obvious respects. As is readily apparent to those skilled in the art, variations and modifications can be effected while remaining within the spirit and scope of the invention. Accordingly, the foregoing disclosure, description, and figures are for illustrative purposes only and do not in any way limit the invention, which is defined only by the claims.

What is claimed is:

1. An inrush current limiter comprising:
   a current sensing device coupled to a main device that is configured to sense a scaled sense current from the main device;
   a current control device coupled to the current sensing device;
   a gate driver coupled to the main device and the current control device that is configured to drive a gate-to-source voltage of the main device; and a source voltage monitor coupled to the gate driver and the current control device, wherein the source voltage monitor is configured to monitor a source voltage of the main device.

2. The inrush current limiter of claim 1, wherein the current sensing device is a scaled down MOSFET version of a main MOSFET.

3. The inrush current limiter of claim 2, wherein an operational amplifier is included to measure a voltage from the main device at a terminal that is compensated for resistive losses.

4. The inrush current limiter of claim 1, wherein the main device is a metal-oxide-semiconductor field-effect transistor (MOSFET) device.

5. The inrush current limiter of claim 4, wherein the MOSFET device comprises a main MOSFET and a sense MOSFET.

6. The inrush current limiter of claim 5, wherein the scaled sense current of the sense MOSFET is substantially 2000 times smaller than a current of the main MOSFET.

7. The inrush current limiter of claim 1, wherein the source voltage monitor further comprises:
a level shifting device;
an analog to digital converter (ADC); and
a voltage comparator.

8. The inrush current limiter of claim 7, wherein the ADC comprises a successive approximation register (SAR).

9. The inrush current limiter of claim 8, wherein the SAR is a 12-bit SAR.

10. An inrush current limiter comprising:
a current control device coupled to a main device that compensates for resistive losses in the main device;
a gate driver coupled to the main device and the current control device that is configured to drive a gate-to-source voltage of the main device; and
a source voltage monitor coupled to the gate driver and the current control device, wherein the source voltage monitor is configured to monitor a source voltage of the main device.

11. The inrush current limiter of claim 10, wherein the main device is a metal-oxide-semiconductor field-effect transistor (MOSFET) device.

12. The inrush current limiter of claim 11, wherein the MOSFET device comprises a main MOSFET and a sense MOSFET.

13. The inrush current limiter of claim 10, wherein the source voltage monitor further comprises:
a level shifting device;
an analog to digital converter (ADC); and
a voltage comparator.

14. The inrush current limiter of claim 13, wherein the ADC comprises a successive approximation register (SAR).

15. The inrush current limiter of claim 14, wherein the SAR is a 12-bit SAR.

16. A method of limiting an inrush current in a main device, the method comprising:
sensing a scaled sense current from the main device;
controlling a current in the main device based upon the scaled sense current;
driving a gate-to-source voltage of the main device with the controlled current; and
monitoring an output voltage of the main device to identify a type of load coupled to the main device.

17. The method of claim 16, further comprising:
determining that the load coupled to the main device is a capacitive load when the output voltage displays a linear increase.

18. The method of claim 17, further comprising:
charging a gate of the main device when the load is determined to be the capacitive load.

19. The method of claim 16, further comprising:
determining that the load coupled to the main device is a low ohmic load when the output voltage does not exceed a threshold level.

20. The method of claim 19, further comprising:
disabling the main device when the load is determined to be a low ohmic load.

* * * * *